May 28, 1968 J. LINDMAYER 3,386,016

FIELD EFFFCT TRANSISTOR WITH AN INDUCED P-TYPE CHANNEL
BY MEANS OF HIGH WORK FUNCTION METAL OR OXIDE
Filed Aug. 2, 1965

INVENTOR
Joseph Lindmayer

BY Connolly and Hutz
ATTORNEYS 3,386,016
FIELD EFFECT TRANSISTOR WITH AN INDUCED P-TYPE CHANNEL BY MEANS OF HIGH WORK FUNCTION METAL OR OXIDE Joseph Lindmayer, Williamstown, Mass., assignor to Sprague Electric Company, North Adams, Mass., a corporation of Massachusetts Filed Aug. 2, 1965, Ser. No. 476,546
9 Claims. (Cl. 317—235)

ABSTRACT OF THE DISCLOSURE

Source and drain regions of one conductivity type are connected within a semiconductive body of the other conductivity type by a P-type channel which is induced therein by high work function material overlying said body.

This invention relates to field effect transistors, and more particularly to metal-oxide-semiconductor devices of the field effect type and to methods of making the same.

In the prior art, the inducement by silicon dioxide of an inherent inversion layer at the silicon surface is known. Thus, although a clean silicon surface is frequently P-type, the oxidized surface is found to always contain an inherent N-type layer which prevents the construction of complementary devices.

In particular the induced channel is utilized in field effect transistors such as the metal-oxide-semiconductor type, commonly referred to as M-O-S transistors. In such devices channel conduction, between source and drain regions of a semiconductor, is controlled by the potential of a metallic layer, or gate, which is adjacent the channel and insulated from it by a thin oxide layer.

Such transistors are generally produced with spaced apart source and drain regions in a silicon wafer of low conductivity by the diffusion of impurities through openings in an oxide layer. The regions are connected by an inversion layer or N-type channel which exists at the silicon surface due to the oxide layer.

A metallic film, or gate, deposited upon the thin oxide layer, is capacitively coupled to the adjacent channel, such that it is possible to invert the N-type channel and alter the conduction characteristics, between the source and drain, by varying the potential impressed upon the gate.

The fact that an N-type channel is formed at the silicon surface, when a silicon wafer of low conductivity is thermally oxidized, results in two types of field effect transistors. The first of these, which may be referred to as "normally on," is produced by diffusing N-type regions in a low conductivity P-type silicon wafer. Since the oxide induced channel is N-type, the device will conduct, between source and drain, when zero voltage is applied to the gate.

The second type results from the diffusion of P-type regions in a low conductivity N-type silicon wafer. Again, the oxide induced channel will be N-type, but, since the source and drain regions are P-type, no conduction will occur with zero gate voltage. Thus, this type may be termed "normally off." To permit conduction to occur, it is necessary to invert the channel from N-type to P-type by applying a negative bias to the gate.

The "normally off" device is inherently more stable than the "normally on" type and is preferred in switching circuits; however, a disadvantage of the above is that such conduction is by means of holes which are less mobile than electrons. Furthermore, the inherent N-type channel restricts the manufacturing of complementary devices of both types.

It is an object of this invention to overcome the foregoing and related disadvantages of the prior art.

Another object of this invention is to produce a field effect transistor having N-type source and drain regions and a P-type channel.

A further object of this invention is to provide a method of producing an induced P-type surface channel in a semiconductor.

A still further object of this invention is to provide a "normally off" type field effect transistor in which conduction is by electrons.

A still further object of this invention is to provide complementary field effect transistors.

These and other objects of this invention will become apparent from the following specification and the accompanying drawing, in which.

Generally, this invention relates to devices produced by control of a dielectric layer on the surface of a semiconductor, so as to induce regions of either conductivity type within the semiconductor, and to methods of manufacturing the same.

In its broadest scope, the invention provides a transistor comprising a semiconductor body of one conductivity type, a source and drain region of opposite conductivity type within the body, an insulating coating overlying the body, an induced P-type channel connecting the regions, and a metallic gate layer overlying the coating adjacent the channel.

Briefly, the process for forming a transistor according to this invention comprises the steps of forming separate regions of one type conductivity in a semiconductor body of opposite conductivity type, forming an insulating coating on the semiconductor surface between the regions, and modifying the insulating coating, with a material of higher work function than the semiconductor body, to form a P-type channel within the body.

In the preferred process, the first step in the construction of a transistor, according to this invention, is the forming of a silicon body having low P-type conductivity. A surface of the silicon is then thermally oxidized and suitable openings made for the diffusion of source and drain regions. N-type impurities are then diffused through the separate openings, into the body by heating at elevated temperatures.

The silicon dioxide coating, overlying the area separating the regions, is then etched to approximately one-tenth of its original thickness and the inherent N-type channel inverted to P-type, between the regions, by depositing platinum over the thinned oxide coating. The device is then completed by the attachment of terminals to the regions and the platinum layer.

Figure 1:
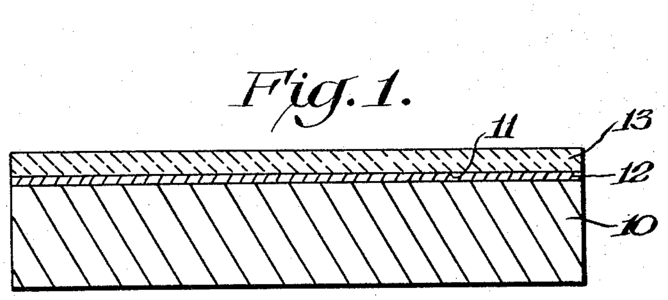
FIGURE 1 is a view in section of an oxidized silicon body having an inherent N-type channel.

Referring now to the drawing and more particularly to FIGURE 1 thereof, there is shown a body 10 of low conductivity P-type silicon having an oxide coating 13 overlying a surface 11 and an N-type inversion layer 12 within the body 10. The structure shown is fabricated by growing a P-type monocrystalline silicon body 10. Thereafter a suitable masking coat 13 such as silicon dioxide or the like is deposited on an upper surface 11 by suitable means such as by thermal oxidation. The oxide coating, having a lower work function than silicon, induces an unstable N-type inversion layer 12 within the silicon body 10 beneath the oxidized surface 11. A stable N-type layer is induced at this stage by removing the ionic contributions of the oxide such as, for example, by heating the structure at approximately 250° C. for 48 hrs, or more, however, it should be understood, that such stabilization could also be accomplished during later stages of construction.

Figure 2:
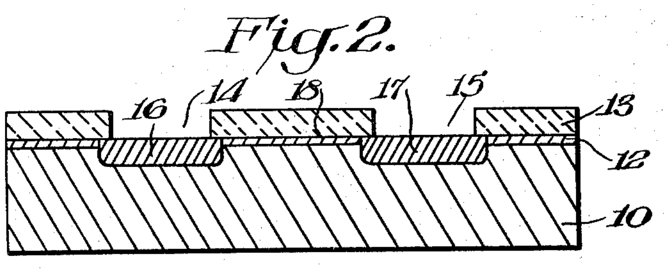
FIGURE 2 is a view in section of the oxidized silicon body with source and drain regions formed within.

As shown in FIGURE 2 suitable openings 14 and 15 are made in coating 13 to expose separate portions of the silicon surface. These openings, which may be of any shape, are narrow parallel slits in the preferred embodiment. N-type source and drain regions 16 and 17 are then formed in the silicon body 10 by, for example, the diffusion of N-type impurities, such as phosphorus antimony or bismuth, through the openings 14 and 15. Accordingly an impurity of the type described is deposited on the exposed portions of surface 11 and the structure heated at elevated temperature.

The structure then comprises N-type source and drain regions 16 and 17 within a P-type silicon body 10, interconnected by an induced N-type channel 18. It should be noted that channel 18 is that portion of the inversion layer 12, which connects the diffused regions 16 and 17.

Figure 3:
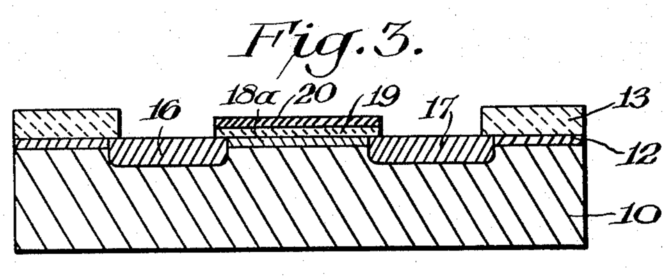
FIGURE 3 is a view in section of the structure of FIGURE 2 with a metallic gate layer; and, FIGURE 4 is a view in section of the completed transistor.

In the preferred embodiment, channel 18 is made P-type by reducing the thickness of the oxide coating 13 adjacent channel 18, and thereafter depositing a suitable metallic layer 20 over the reduced coating. As illustrated in FIGURE 3 the silicon dioxide coating 13 is reduced in thickness adjacent channel 18 by suitable means, such as etching or the like, to a thin coating 19, of approximately one-tenth the original oxide thickness. Thereafter, a metallic gate layer 20 having higher work function than silicon, for example, platinum, is deposited upon the thin oxide coat 19 to induce an underlying P-type channel 18*a* and form PN junctions with the regions 16 and 17. The gate layer 20 is deposited by any suitable means such as plating, vapor deposition or the like, however, to produce the P-type channel, the work function of layer 20 must exceed that of silicon.

Platinum is preferred as a modifying agent since its work function is about 5.3 ev., well above the silicon value of 4.8 ev.; however, other materials whose work function exceeds silicon would also be suitable in forming a p-type channel as described.

Figure 4:
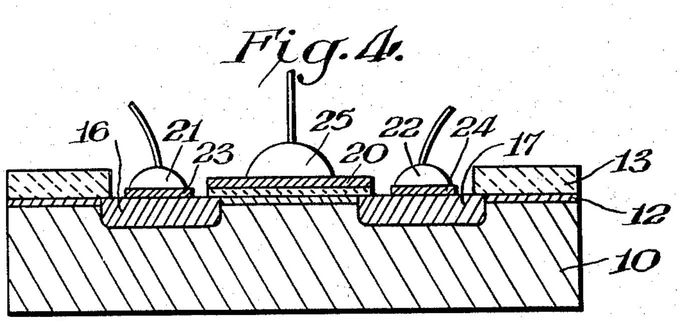

Finally, as shown in FIGURE 4, the transistor is completed by attaching terminals in low resistance connection to the regions 16 and 17 and the gate layer 20. Thus, a source terminal 21 and drain terminal 22 connect to regions 16 and 17, respectively, through suitable metallized coatings 23 and 24, such as aluminum or the like, while gate terminal 25 is connected directly to the metallic layer 20 which is utilized, in this embodiment, as the gate.

The described transistor is "normally off" since no current will flow between source and drain at zero gate potential due to the PN junction provided by P-type channel connecting the N-type regions; however, with positive gate voltage the channel will be inverted to N-type thereby permitting conduction between source and drain. As indicated, such conduction will be by means of electrons which have about three times higher mobility than holes.

While the transistor has been described as an individual device, it should be understood that the structure could be made in large sections and diced up to provide individual devices as shown. In addition, complementary devices may be constructed in the same substrate by modifying the oxide layer, or not, as required.

Furthermore, since the oxide coating was modified, only in the area adjacent the connecting channel 18, an N-type inversion layer will still remain beneath the unmodified coating. In some cases, such as in integrated circuits etc., it may be advantageous to modify all the oxide coating adjacent the regions to induce a P-type surface layer enclosing both regions, so as to connect both regions and also isolate them from adjacent devices of the same substrate.

Although a preferred method of making the inherent channel P-type has been described, other methods are possible. For example, the P-type channel may be produced in a silicon body, beneath a silicon dioxide layer, by the solid state diffusion of platinum into the oxide. This may be accomplished by evaporating a platinum layer over a conventional thickness of oxide and then heating the assembly to 300° C. or higher.

A P-type channel may also be formed by first depositing a thin layer of platinum on a clean silicon surface and thereafter thermally growing a silicon dioxide layer over the metal. Accordingly, the platinum is incorporated in the oxide, during the thermal oxidation, to provide a P-type inversion layer at the semiconductor surface.

Furthermore, the channel may be made P-type by interrupting the oxide growth, introducing a thin platinum layer, and then continuing the oxide growth.

Once the coating has been modified as indicated in the alternative methods described above, a gate layer of any suitable metal is deposited and terminals attached as previously described. Metals, other than platinum may be utilized as a gate in these modifications, since the gate metal has little effect on the inversion layer once the oxide coating has been modified with a high work function material.

The same principles also apply to various insulators such as dielectric compounds of silicon, and to other semiconductor materials, such as for example germanium. That is, where a P-type surface channel is desired, an insulating coating having higher work function than the semiconductor material may be deposited upon the surface or, as in the described embodiment, a low work function coating may be modified by a high work function impurity.

Advantageously, complementary devices of the type described may be constructed in accordance with the invention. Thus, in addition to the "normally off" device, having N-type regions and a P-type channel described in detail above, a "normally on" device having P-type regions and a P-type channel may also be constructed.

As previously indicated, complementary devices can also be produced in the same substrate. Thus, a number of N-type regions could be diffused in a low conductivity P-type wafer and the oxide coating modified between the regions to form P-type or N-type channels. Complementary devices would then exist since the regions separated by coating modified with a high work function impurity would have a P-type channel and be "normally off" whereas the regions separated by the low work function coating would have connecting N-type channels and be "normally on." The N-type channel is induced, as indicated, by untreated silicon dioxide, since this has a lower work function than silicon, however, it should also be noted that the N-type channel may be further enhanced by the addition of low work function impurities such as aluminum or the like.

An alternative construction would be to form P-type regions in a low conductivity N-type wafer and again modify the oxide between some of the regions. It should be understood, that in each case the channel is stabilized, at a suitable construction stage, by heating as indicated above.

Individual complementary devices could be realized from the single substrate or these could be utilized within a single substrate in conjunction with other devices for novel circuits switched by complementary bias potential.

Furthermore, although the invention has been described in terms of a specific embodiment, it should be understood that many different embodiments of this invention may be made without departing from the spirit and scope hereof, and that the invention is not to be limited except as defined in the appended claims.

What is claimed is:

1. A field effect transistor comprising spaced apart source and drain regions of one conductivity type within a semiconductive body of the other conductivity type, an insulating layer overlying said body, a metallic gate layer overlying said insulating layer, and at least one of said overlying layers having a higher work function than that of said body for inducing a P-type channel connecting said regions within said body.

2. The transistor of claim 1 wherein said body is silicon and said coating comprises an oxide of silicon.

3. The transistor of claim 1 wherein said insulating layer has a higher work function than that of said body for inducing said P-type channel therein.

4. The transistor of claim 3 including a metallic layer of high work function material deposited on said body, said insulating layer deposited on said high work function material, and heat treating of said layers for inducing of said P-type channel in said body.

5. The transistor of claim 3 wherein said insulating layer includes a thin insulating layer deposited on said body, a metallic layer of high work function material deposited on said thin insulating layer, a further insulating layer deposited over said high work function material, and heat treating of said layers for inducing said P-type channel in said body.

6. The transistor of claim 5 wherein said high work function material is platinum.

7. The transistor of claim 1 wherein said metallic gate layer has a higher work function than that of said body for inducing said P-type channel therein.

8. The transistor of claim 7 wherein said gate layer is platinum.

9. A method of making a transistor including the steps of forming spaced apart regions of one conductivity type within a semiconductor body having low conductivity of the other conductivity type, thermally forming an insulating coating on a surface of said body, reducing the thickness of said coating in the area between said regions to a small proportion of its original thickness, and inducing a P-type channel within said body between said regions by depositing on said coating of reduced thickness a metallic gate layer having higher work function than said body.

References Cited

UNITED STATES PATENTS

| | | | |
|---|---|---|---|
| 3,216,075 | 7/1966 | Carman | 29—25.3 |
| 3,263,095 | 7/1966 | Fang | 307—88.5 |
| 3,266,127 | 8/1966 | Harding | 29—155.5 |
| 3,272,989 | 9/1966 | Sekely | 307—88.5 |

JOHN W. HUCKERT, *Primary Examiner.*

JAMES D. KALLAM, *Examiner.*

M. EDLOW, *Assistant Examiner.*